(12) United States Patent
Kurokawa

(10) Patent No.: US 8,373,452 B2
(45) Date of Patent: Feb. 12, 2013

(54) BUFFER CIRCUIT HAVING SWITCH CIRCUIT CAPABLE OF OUTPUTTING TWO AND MORE DIFFERENT HIGH VOLTAGE POTENTIALS

(75) Inventor: Tatsufumi Kurokawa, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 0 days.

(21) Appl. No.: 13/437,774

(22) Filed: Apr. 2, 2012

(65) Prior Publication Data

US 2012/0187982 A1 Jul. 26, 2012

Related U.S. Application Data

(63) Continuation of application No. 13/137,238, filed on Jul. 29, 2011, now Pat. No. 8,174,296, which is a continuation of application No. 12/659,248, filed on Mar. 2, 2010, now Pat. No. 8,008,952.

(30) Foreign Application Priority Data

Mar. 25, 2009 (JP) ................................. 2009-073531

(51) Int. Cl.
*H03K 3/00* (2006.01)
(52) U.S. Cl. ............................ 327/108; 327/112; 326/87
(58) Field of Classification Search .................. 327/108, 327/112; 326/87
See application file for complete search history.

(56) References Cited

U.S. PATENT DOCUMENTS

| | | | |
|---|---|---|---|
| 4,408,135 A | 10/1983 | Yuyama et al. | |
| 4,697,107 A | 9/1987 | Haines | |
| 4,731,553 A | 3/1988 | Van Lehn et al. | |
| 5,894,238 A | 4/1999 | Chien | |
| 5,914,618 A | 6/1999 | Mattos | |
| 6,265,892 B1 | 7/2001 | Jou et al. | |
| 6,433,584 B1* | 8/2002 | Hatae | 326/80 |
| 7,009,537 B2 | 3/2006 | Kabune | |
| 7,583,105 B2 | 9/2009 | Stopel et al. | |
| 2003/0030484 A1* | 2/2003 | Kang et al. | 327/544 |
| 2005/0160334 A1 | 7/2005 | Kabune | |

FOREIGN PATENT DOCUMENTS

| | | |
|---|---|---|
| JP | 3-185923 A | 8/1991 |
| JP | 3861874 B2 | 10/2006 |

* cited by examiner

*Primary Examiner* — Kenneth B. Wells
(74) *Attorney, Agent, or Firm* — McGinn IP Law Group, PLLC

(57) ABSTRACT

A buffer circuit includes a first node receiving a first voltage, a second node receiving a second voltage lower than the first voltage, a third node, an output node driving the first voltage and the second voltage, a first transistor coupled between the first node and the output node, a second transistor coupled between the second node and the output node, one end of the second transistor being connected to the second node, another end of the second transistor being connected to the third node, and a switch circuit coupled between the output node and the third node. Both of the first transistor and the switch circuit include a transistor having a first breakdown voltage. The second transistor has a second breakdown voltage being different from the first breakdown voltage.

9 Claims, 8 Drawing Sheets

BUFFER CIRCUIT HAVING SWITCH CIRCUIT CAPABLE OF OUTPUTTING TWO AND MORE DIFFERENT HIGH VOLTAGE POTENTIALS

The present application is a Continuation Application of U.S. patent application Ser. No. 13/137,238, filed on Jul. 29, 2011, now U.S. Pat. No. 8,174,296, which is a Continuation Application of U.S. patent application Ser. No. 12/659,248, filed on Mar. 3, 2010, now U.S. Pat. No. 8,008,952, which are based on Japanese patent application No. 2009-073531, filed on Mar. 25, 2009, the entire contents of which is incorporated herein by reference.

BACKGROUND OF THE INVENTION

1. Field of the Invention

The present invention relates to a butler circuit and to tolerant buffer circuit capable of outputting two or more signal outputs of different high voltage levels, for example, in a general-purpose logic output circuit.

2. Description of Related Art

As miniaturization and more functionality by minute forming of the LSI (Large Scale Integration) proceed, various portable devices are being realized. Many of them are required to operate using lithium ion (Li+) batteries. In such portable devices, a system power supply LSI taking on power supply control needs to supply control signals for supplying power supply to many peripheral LSI's.

For this reason, a tolerant buffer for outputting a logic according to various voltage levels of the peripheral LSI becomes necessary for the system power LSI. Along with lowering of power supply voltages in recent years, their power ranges have been widening.

FIG. 8 is a circuit diagram of the tolerant buffer circuit for explaining a problem of the present invention. In the tolerant buffer circuit, control signals S1, S2 inside the LSI are inputted into it, and an output signal S3 to the outside of the LSI is outputted. Here, the control signal S1 is a signal that selects an output level when a high voltage (H: High) level is outputted from the output signal 33. Moreover, the control signal S2 is a signal that controls an output logic of the output signal S3. A power supply voltage VDDH and a power supply voltage VDDL are signal levels when a H level is outputted from the output signal S3. Here, the power supply voltage VDDH is a level higher than the power supply voltage VDDL.

The tolerant buffer circuit has inverter circuits P4, P8 controlled with a power supply voltage VDDH level, NAND circuits P5, P6 controlled with the power supply voltage VDDH level, a level shifter circuit P7 working between the power supply voltages VDDH and VDDL, PMOS transistors M109, M111, and an NMOS transistor M110.

When the control signal S2 is at a low voltage (L: Low) level, the output signal S3 becomes L level regardless of a logic of the control signal S1. When the control signal S2 is at H level and the control signal S1 is at H level, the output signal S3 becomes the power supply voltage VDDH level. On the other hand, when the control signal S2 is at H level and the control signal S1 is at L level, the output signal S3 becomes a power supply voltage VDDL level.

When the control signals S1, S2 are at H level, since the output signal S3 becomes the power supply voltage VDDH level, it is necessary to make a backgate of the PMOS transistor M109 become a level equal to that of the power supply voltage VDDH. Therefore, the power supply voltage VDDH is fed to the backgate of the PMOS transistor M109. Incidentally, Japanese Patent Application Laid Open No. Hei3 (1991)-185923 (Patent Document 1) discloses a tolerant buffer circuit similar with that of FIG. 8.

SUMMARY

However, there was a problem that it was difficult for the PMOS transistor M109 to simultaneously fulfill a condition of having a breakdown voltage that enables it to operate with a power supply voltage VDDH level and a condition of making it possible to perform gate control with a power supply voltage VDDL level.

Here, if the PMOS transistor M109 does not have the breakdown voltage that enables it to operate at the power supply voltage VDDH level, when the control signals S1, S2 are at H level, then an output signal 53 becomes the power supply voltage VDDH level. Therefore, the power supply voltage VDDH level is applied to the PMOS transistor M109, and it comes to have an insufficient breakdown voltage. On the other hand, if the PMOS transistor M109 cannot be gate controlled with the power supply voltage VDDL level, when the control signal S1 is at L level and the control signal S2 is at H level, then the PMOS transistor M109 cannot turn ON. Therefore, it cannot output the power supply voltage VDDL level as the output signal S3.

A buffer circuit according to an exemplary aspect of the present invention outputs a low voltage and high voltages as opposed logic signals and a first high voltage and a second high voltage that is higher than the first high voltage as the high voltages. The buffer includes a logic control circuit, a first MOS transistor provided between a power supply for feeding the first high voltage and an output terminal, the first MOS transistor including a gate receiving a control signal of the first high voltage level outputted from the logic control circuit, and a backgate receiving the first high voltage, a second MOS transistor provided between a power supply for feeding the second high voltage and the output terminal, the second MOS transistor including a gate receiving a control signal of the second high voltage level outputted from the logic control circuit, and a backgate receiving the second high voltage, and a first switch circuit provided between the first MOS transistor and the output terminal and controlled ON/FF state thereof by the control signal of the second high voltage level.

Since the first switch circuit whose ON/OFF is controlled by the control signal of the second high voltage level is provided between the first MOS transistor and the output terminal, it is possible to feed the first high voltage to the backgate of the first MOS transistor that can be gate controlled with the first high voltage level. Therefore, it is possible to provide a buffer circuit that outputs a low voltage and high voltages as opposed logic signals, can output two or more different voltages as the high voltages, and operates stably.

According to the exemplary aspect, it is possible to provide a buffer circuit that outputs a low voltage and high voltages as opposed logic signals, can output two or more different voltages as the high voltages, and operates stably.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
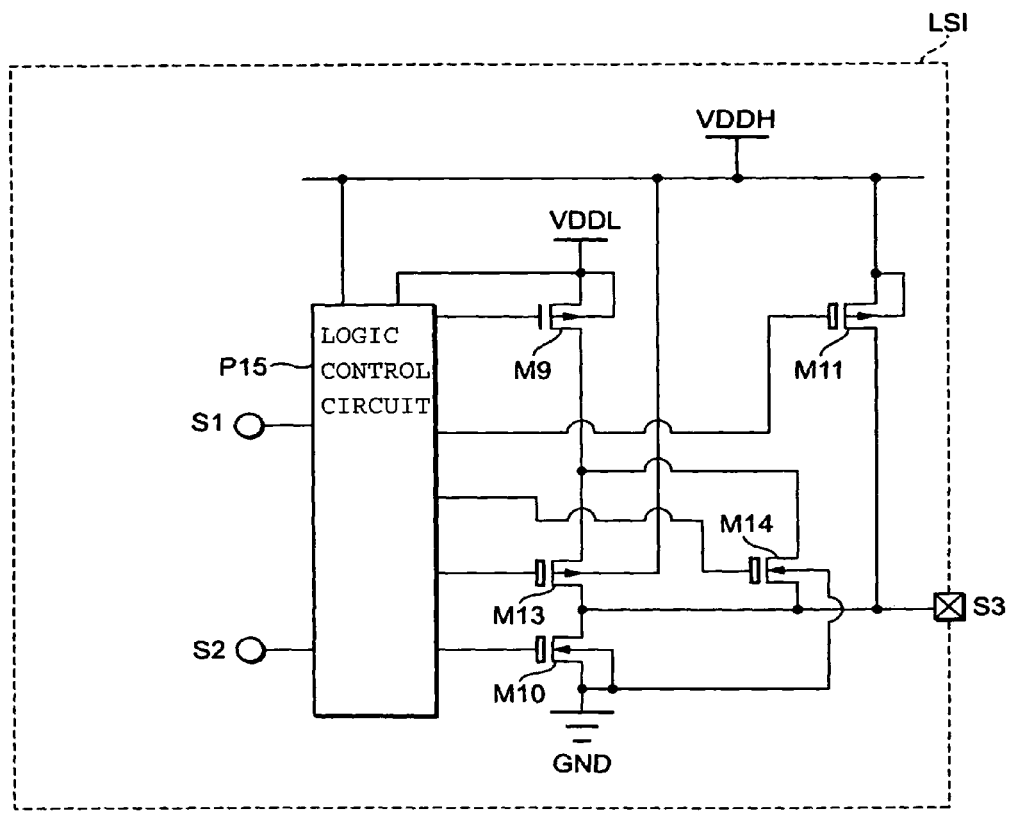
FIG. 1 is a circuit diagram of a tolerant buffer circuit according to a first exemplary embodiment of the present invention.
Figure 2:
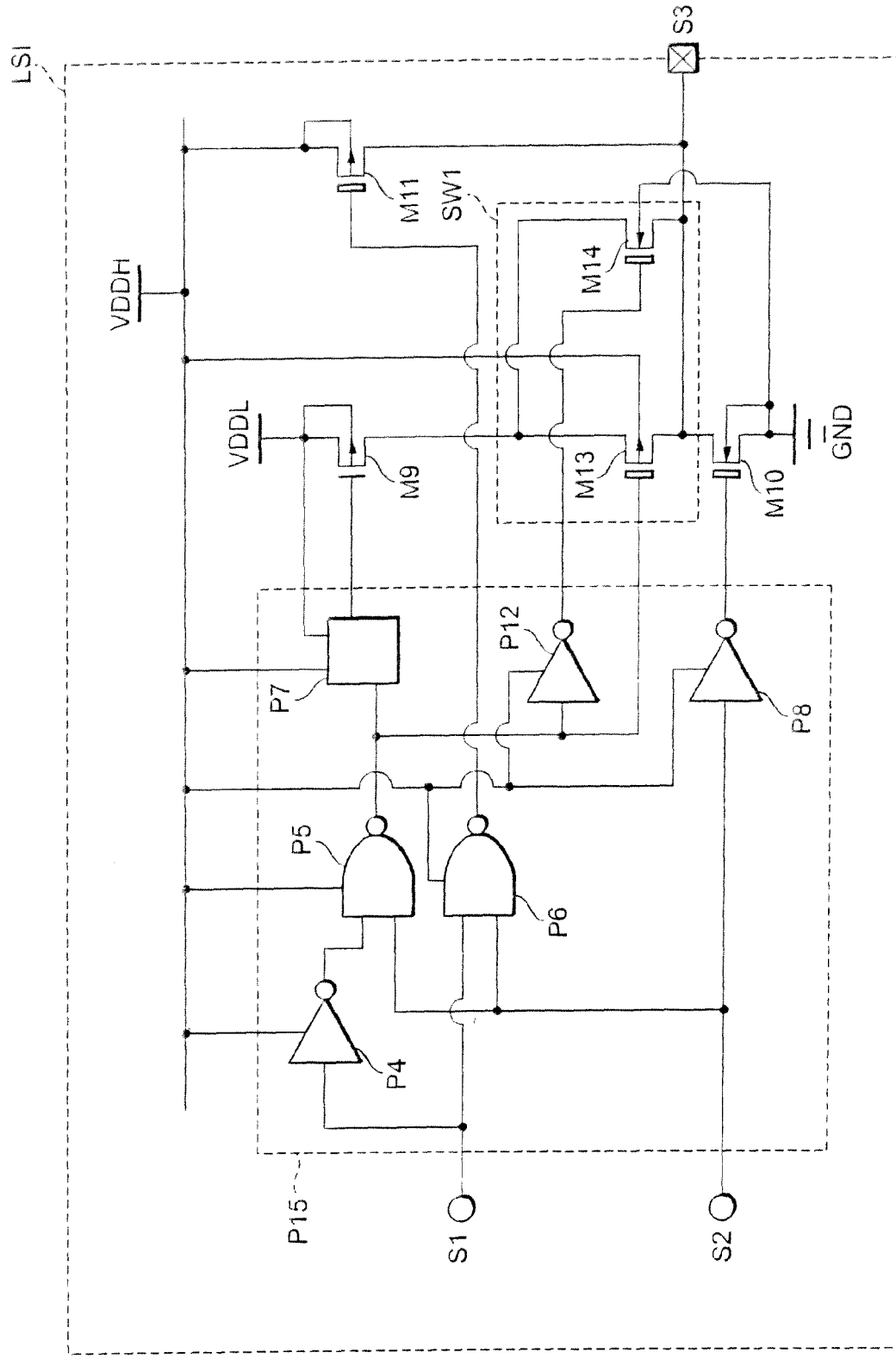
FIG. 2 is a detailed circuit diagram of the tolerant buffer circuit of FIG. 1.

FIG. 1 is a circuit diagram of a tolerant buffer circuit according to a first exemplary embodiment of the present invention. FIG. 2 is a detailed circuit diagram of the tolerant buffer circuit of FIG. 1. As shown in FIGS. 1, 2, the tolerant buffer circuit is provided in an LSI. Control signals S1, S2 inside the LSI are inputted into the tolerant buffer circuit, and an output signal S3 to the outside of the LSI is outputted from it. Here, the control signal S1 is a signal for selecting an output level when a high voltage (H: High) level is outputted from the output signal S3. Moreover, the control signal S2 is a signal for controlling an output logic (H or L) of the output signal S3. A first power supply voltage VDDL and a second power supply voltage VDDH are signal levels when a H level is outputted from the output signal S3. Here, the power supply voltage VDDH is a level higher than the power supply voltage VDDL.

As shown in FIG. 1, the tolerant buffer circuit has a logic control circuit P15, a PMOS transistor M9 (for example, a first transistor) that can be gate controlled with a VDDL level, NMOS transistors M10 (for example, a third transistor), M14 each having a breakdown voltage more than or equal to a VDDH level, and PMOS transistors M11 (for example, a second transistor), M13 each having the breakdown voltage more than or equal to the VDDH level.

Here, as shown in FIG. 2, the logic control circuit P15 is equipped with inverter circuits P4, P8, and P14 controlled with the power supply voltage VDDH level, NAND circuits P5, P6 controlled with the VDDH level, and a level shifter circuit P7 from the power supply voltage VDDH to the VDDL level.

The control signal S1 is inputted into one input terminal of the NAND circuit P6, and at the same time is inputted into the other input terminal of the NAND circuit P5 through the inverter circuit P4. The control signal S2 is inputted into the other input terminals of the NAND circuits P5 and P6, and at the same time is inputted into a gate of the NMOS transistor M10 through the inverter circuit P8.

An output signal from the NAND circuit P5 is inputted into the level shifter circuit P7, and the signal level is changed from the power supply voltage VDDH to the VDDL. Then the output signal from the level shifter circuit P7 is inputted into a gate of the PMOS transistor M9. Moreover, the output signal from the NAND circuit P5 is inputted into a gate of the NMOS transistor M14 through an inverter circuit P12. Furthermore, the output signal from the NAND circuit P5 is inputted into a gate of the PMOS transistor M13. On the other hand, the output signal from the NAND circuit P6 is inputted into a gate of the PMOS transistor M11.

As shown in FIGS. 1, 2, a ground voltage GND is fed to a source and a backgate of the NMOS transistor M10. A drain of the NMOS transistor M10 is connected to drains of the PMOS transistors M11. M13 and a source of the NMOS transistor M14. Moreover, this connection node is connected to the output terminal, and the output terminal outputs the output signal S3.

Here, the PMOS transistor M13 and the NMOS transistor M14 are connected in parallel. Then, a source of the PMOS transistor M13 and a drain of the NMOS transistor M14 are commonly connected to a drain of the PMOS transistor M9. In addition, the power supply voltage VDDH is fed to a backgate of the PMOS transistor M13, and the ground voltage GND is fed to a backgate of the NMOS transistor M14.

As described above, the output signal from the NAND circuit P5 is fed to the gate of the PMOS transistor M13, and an inverted output signal from the NAND circuit P5 is fed to the gate of the NMOS transistor M14. That is, as shown in FIG. 2, the PMOS transistor M13 and the NMOS transistor M14 connected in parallel constitute a switch circuit SW1 (for example, a first switch circuit) provided between the NMOS transistor M10 and the PMOS transistor M9. Then, the switch circuit SW1 becomes ON when the PMOS transistor M9 is ON, and becomes OFF when the PMOS transistor M9 is OFF.

Figure 8:
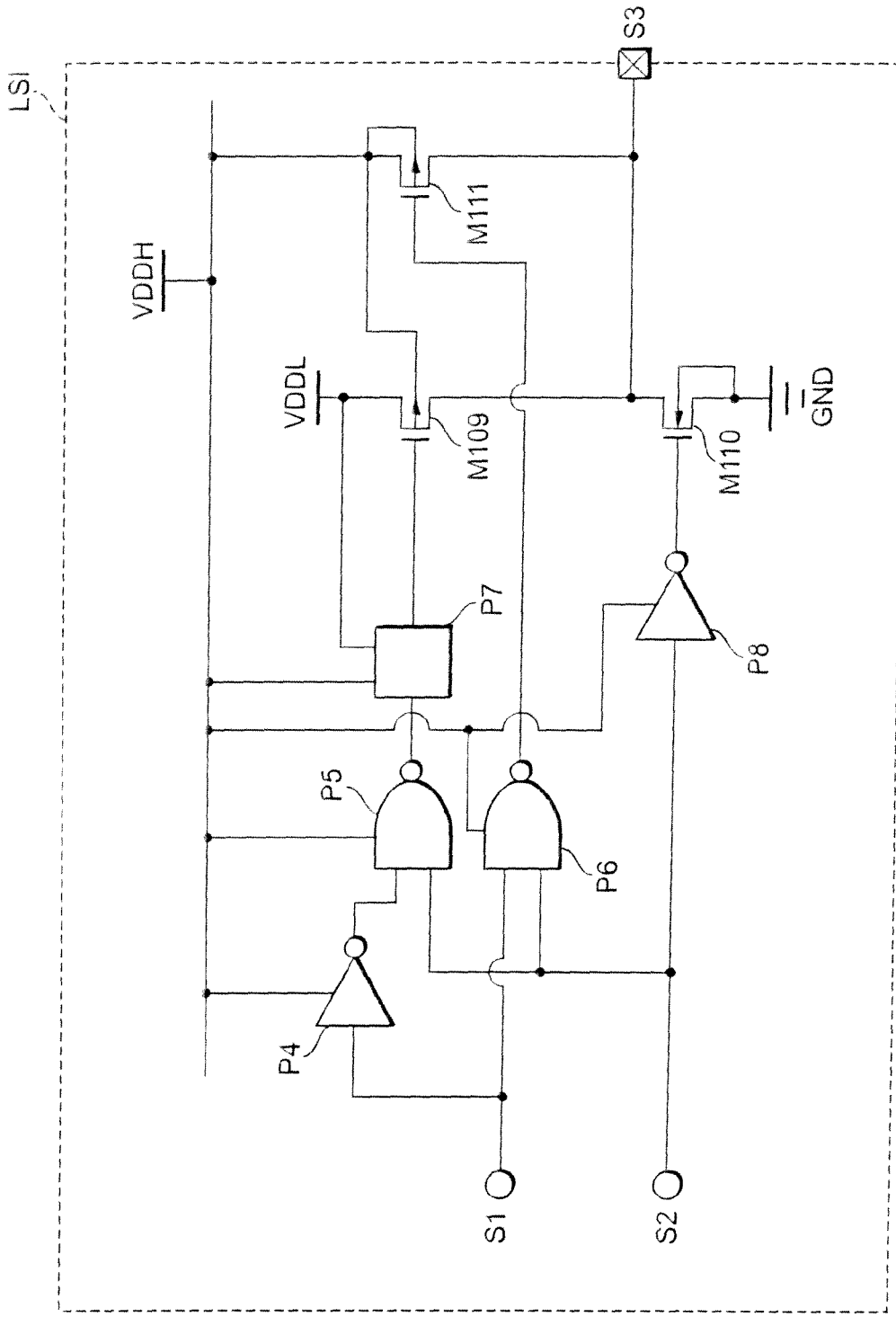
FIG. 8 is a circuit diagram of the tolerant buffer circuit for explaining a problem of the present invention.

The power supply voltage VDDL is fed to a source and a backgate of the PMOS transistor M9. The power supply voltage VDDH was fed to a backgate of a PMOS transistor M109 of FIG. 8. However, in the tolerant buffer circuit, since the switch circuit SW1 is provided, it is not necessary to feed the power supply voltage VDDH to the backgate of the PMOS transistor M9. Therefore, the PMOS transistor M9 does not need to have as high a breakdown voltage as the power supply voltage VDDH level. On the other hand, the power supply voltage VDDH is fed to a source and a backgate of the PMOS transistor M11.

Figure 3:
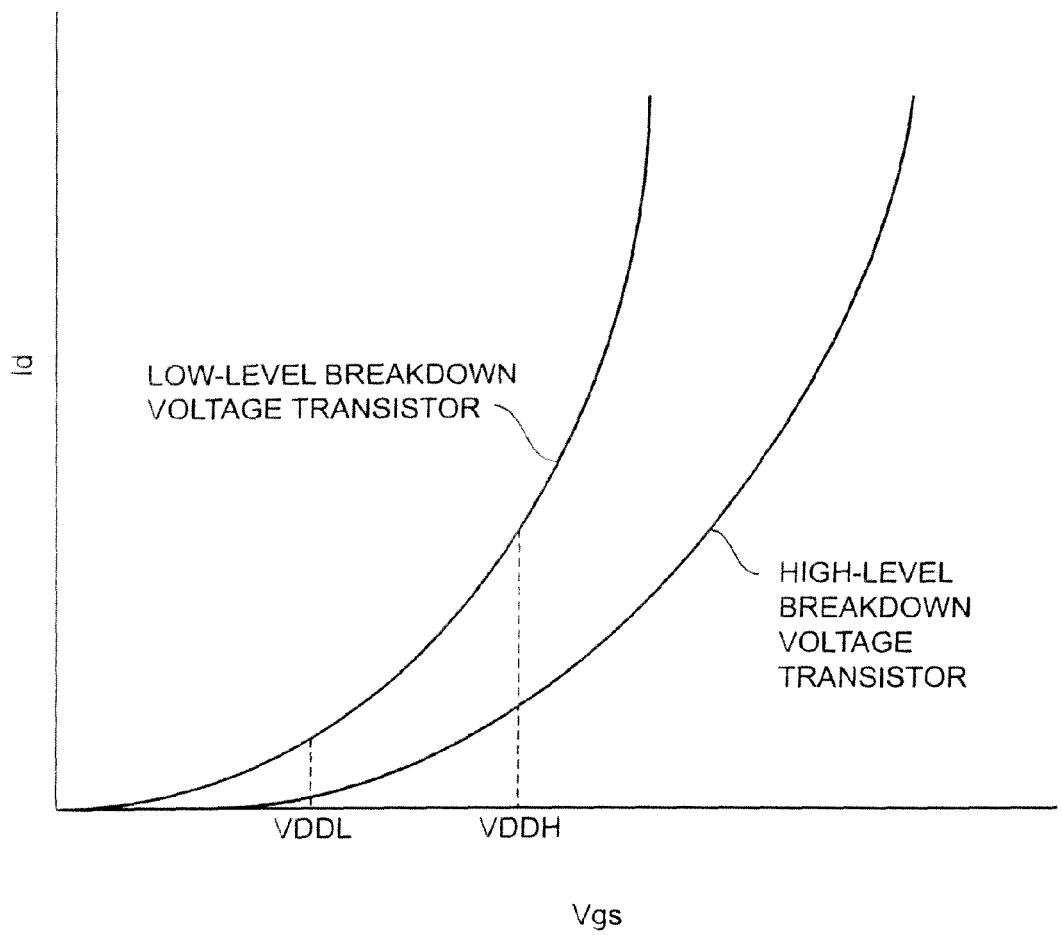
FIG. 3 is a Vgs-Id characteristic diagram showing a change of a drain current with respect to a gate-source voltage of a transistor.

FIG. 3 is a Vgs-Id characteristic diagram showing a change of a drain current Id with respect to a gate source voltage Vgs of the transistor. The diagram shows a transistor of a low-level breakdown voltage and a transistor of a high-level breakdown voltage being in comparison. In the tolerant buffer circuit, the PMOS transistor M9 is the low-level breakdown voltage transistor of FIG. 3, and can be gate controlled even with the power supply voltage VDDL level. On the other hand, the PMOS transistors M11, M13 and the NMOS transistors M10, M14 are a high-level breakdown voltage transistor of FIG. 3, and cannot be gate controlled with the power supply voltage VDDL level.

As described above, in the tolerant buffer circuit, the switch circuit SW1 is provided between the output terminal and a source of the PMOS transistor M9 so that the power supply voltage VDDH may not be applied to the source of the PMOS transistor M9. Therefore, it is possible to feed not the power supply voltage VDDH but the VDDL to the backgate of the PMOS transistor M9. Therefore, it is possible to use a transistor that has the low-level breakdown voltage and can be gate controlled even with the power supply voltage VDDL level as the PMOS transistor M9. With this configuration, it is possible to provide the buffer circuit that can output two or more digital signals whose voltage differences between the high voltage level and the low voltage level are different and operates stably.

Next, operations will be explained.

When the control signal S2 is at L level, since the NMOS transistor M10 becomes ON and the PMOS transistors M9 and M11 become OFF regardless of a logic of the control signal S1, the output signal S3 becomes L level.

When the control signal S2 is at H level and the control signal S1 is at H level, since the NMOS transistor M10 becomes OFF, the PMOS transistor M9 becomes OFF, and the M11 becomes ON, the output signal S3 becomes the power supply voltage VDDH level. Here, since the switch circuit SW1 is OFF, it does not happen that the power supply voltage VDDH is applied to the source of the PMOS transistor M9. Therefore, it is possible to use a transistor that has the breakdown voltage of the power supply voltage VDDL level, i.e., a low level, and can be gate controlled even with the power supply voltage VDDL level as the PMOS transistor M9.

In this case, the power supply voltage VDDH is applied to the drain of the PMOS transistor M13 and the source of the NMOS transistor M14, these transistors constituting the switch circuit SW1. However, since the PMOS transistor M13 and the NMOS transistor M14 have the breakdown voltage of the power supply voltage VDDH level, i.e., a high level, they cause no problems.

When the control signal S2 is at H level and the control signal S1 is at L level, since the NMOS transistor M10 becomes OFF, the PMOS transistor M9 becomes ON, the M11 becomes OFF, and the switch circuit SW1 becomes ON, the output signal S3 becomes the power supply voltage VDDL level. Here, since the PMOS transistor M9 can be gate controlled with the power supply voltage VDDL level, it becomes ON without causing any problems. On the other hand, although the PMOS transistor M13 and the NMOS transistor M14 cannot be controlled with the power supply voltage VDDL level, they are controlled with the power supply voltage VDDH level, and consequently they are without problems.

Second Exemplary Embodiment

Figure 4:
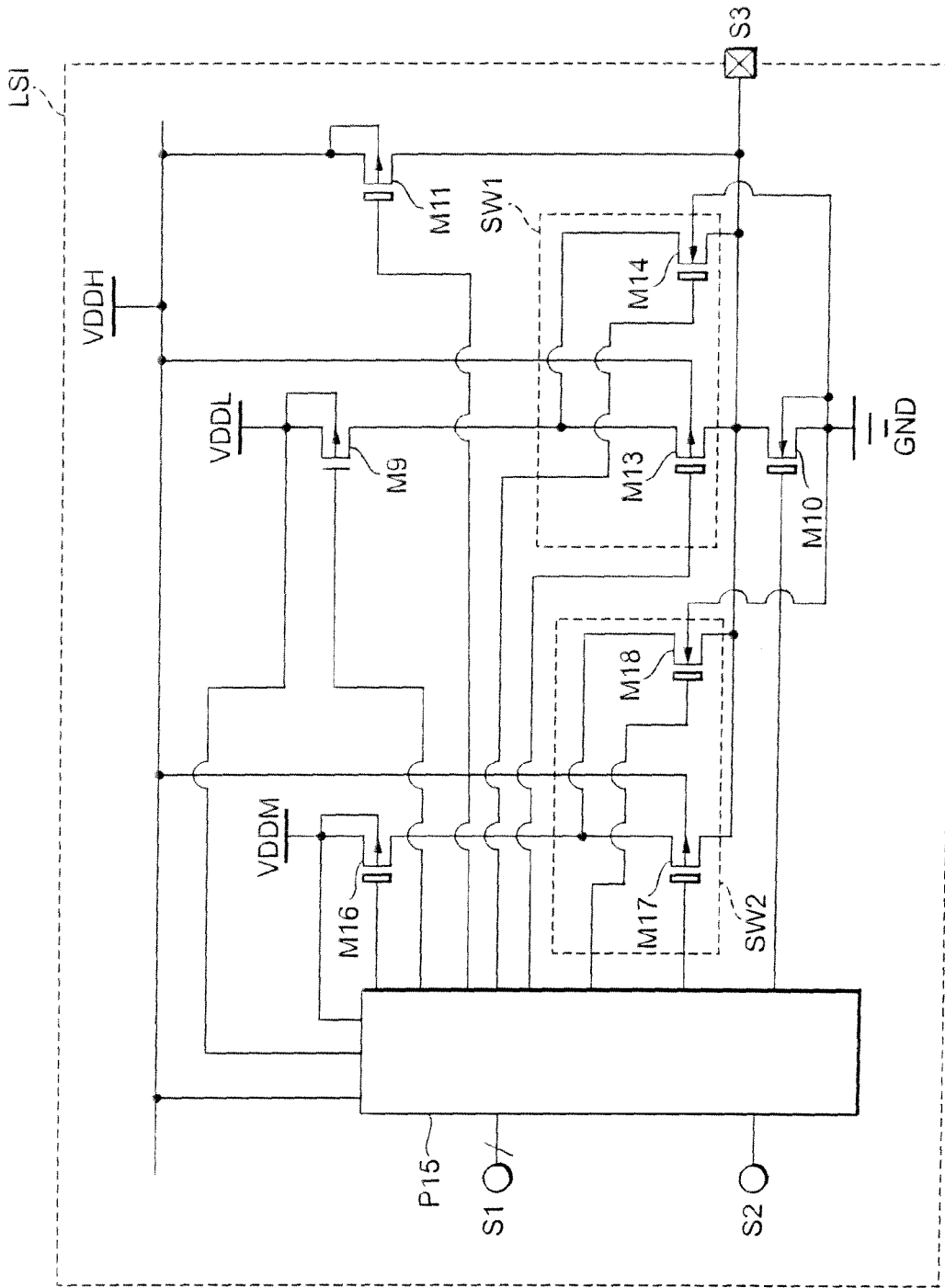
FIG. 4 is a circuit diagram of a tolerant buffer circuit according to a second exemplary embodiment of the present invention.

FIG. 4 is a circuit diagram of a tolerant buffer circuit according to a second exemplary embodiment. Even in the case of tolerant buffer circuit of FIG. 4, the control signals S1, S2 inside the LSI are inputted thereinto and the output signal S3 to the outside of the LSI is outputted therefrom. Here, the control signal S1 is a bus signal for selecting the output level when the H level is outputted from the output signal S3. Moreover, the control signal S2 is a signal for controlling the output logic of the output signal 53.

In addition to the power supply voltages VDDL and VDDH that can be outputted in the tolerant buffer circuit of FIG. 1, it is also possible to output a third power supply voltage VDDM. Here, the power supply voltage VDDM is a voltage between the power supply voltages VDDH and VDDL. Therefore, a PMOS transistor N116 (for example, a fourth transistor) and a switch circuit SW2 (for example, a second switch circuit) are added to the tolerant buffer circuit of FIG. 1. Since other configurations are the same as those of FIG. 2, description thereof will be omitted appropriately.

As shown in FIG. 4, the ground voltage GND is fed to the source and backgate of the NMOS transistor MID. The drain of the NMOS transistor M10 is also connected to a drain of a PMOS transistor M17 and a source of an NMOS transistor M18. Moreover, this connection node outputs the output signal S3.

Here, the PMOS transistor M17 and the NMOS transistor M18 are connected in parallel. Then, a source of the PMOS transistor M17 and a drain of the NMOS transistor M18 are commonly connected to a drain of the PMOS transistor M16. In addition, the power supply voltage VDDH is fed to a backgate of the PMOS transistor M17, and the ground voltage GND is fed to a backgate of the NMOS transistor M18.

As shown in FIG. 4, the PMOS transistor M17 and the NMOS transistor M18 connected in parallel constitute the switch circuit SW2 that is provided between the NMOS transistor M 10 and the PMOS transistor M16. Then, the switch circuit SW2 becomes ON when the PMOS transistor M16 is ON, and becomes OFF when the PMOS transistor M16 is OFF.

The power supply voltage VDDM is fed to a source and a backgate of the PMOS transistor M16. Since also in the tolerant buffer circuit according to the second exemplary embodiment, the switch circuit SW2 is provided, it is not necessary to feed the power supply voltage VDDH to the backgate of the PMOS transistor M16. Therefore, the PMOS transistor M16 does not need to have as high a breakdown voltage as the power supply voltage VDDH level.

In the tolerant buffer circuit according to the second exemplary embodiment, the PMOS transistor M16 does not have as high a breakdown voltage as the power supply voltage VDDH level, and can be gate controlled with a power supply voltage VDDM level. On the other hand, the PMOS transistor M17 and the NMOS transistor M18 are high breakdown voltage transistors of FIG. 3 and cannot be gate controlled with the power supply voltage VDDM level.

As described above, even in the tolerant buffer circuit according to the second exemplary embodiment, the switch circuit SW2 is provided so that the power supply voltage VDDH may not be applied to a source of the PMOS transistor M16. Therefore, it is possible to feed not the power supply voltage VDDH but the VDDM to the backgate of the PMOS transistor M16. Therefore, it is possible to use a transistor that has the breakdown voltage of the power supply voltage VDDM level and can be gate controlled even with the power supply voltage VDDM level as the PMOS transistor M16. With the configuration like this, it is possible to provide the buffer circuit that can output three signals of different high voltage levels and operates stably.

Next, operations will be explained.

When the control signal S2 is at L level, the NMOS transistor M10 becomes ON and other transistors in FIG. 4 become all OFF regardless of the logic of the control signal S1, and consequently the output signal S3 becomes L level.

When the control signal S2 is at H level, according to the bus control signal S1, the output signal S3 becomes any one level of the power supply voltages VDDH, VDDM, and VDDL. If the PMOS transistor M11 becomes ON and other transistors in FIG. 4 become all OFF, then the output signal S3 will become the power supply voltage VDDH level. Here, since the switch circuits SW1, SW2 are OFF, it does not happen that the power supply voltage VDDH is applied to the sources of the PMOS transistors M9, M16.

In this case, the power supply voltage VDDH is applied to a drain of the PMOS transistor M17 and a source of the NMOS transistor M18, these transistors constituting the switch circuit SW2. However, since the PMOS transistor M17 and the NMOS transistor M18 have a breakdown voltage of the power supply voltage VDDH level, i.e., a high level, they do not cause problems. As described in the first exemplary embodiment, this situation is the same also in the switch circuit SW1.

If the PMOS transistor M9 and the switch circuit SW1 become ON and other transistors in FIG. 4 become all OFF, then the output signal S3 will become the power supply voltage VDDL level. Moreover, if the PMOS transistor M16 and the switch circuit SW2 become ON and other transistors in FIG. 4 become all OFF, then the output signal S3 will become the power supply voltage VDDM level.

Third Exemplary Embodiment

Figure 5:
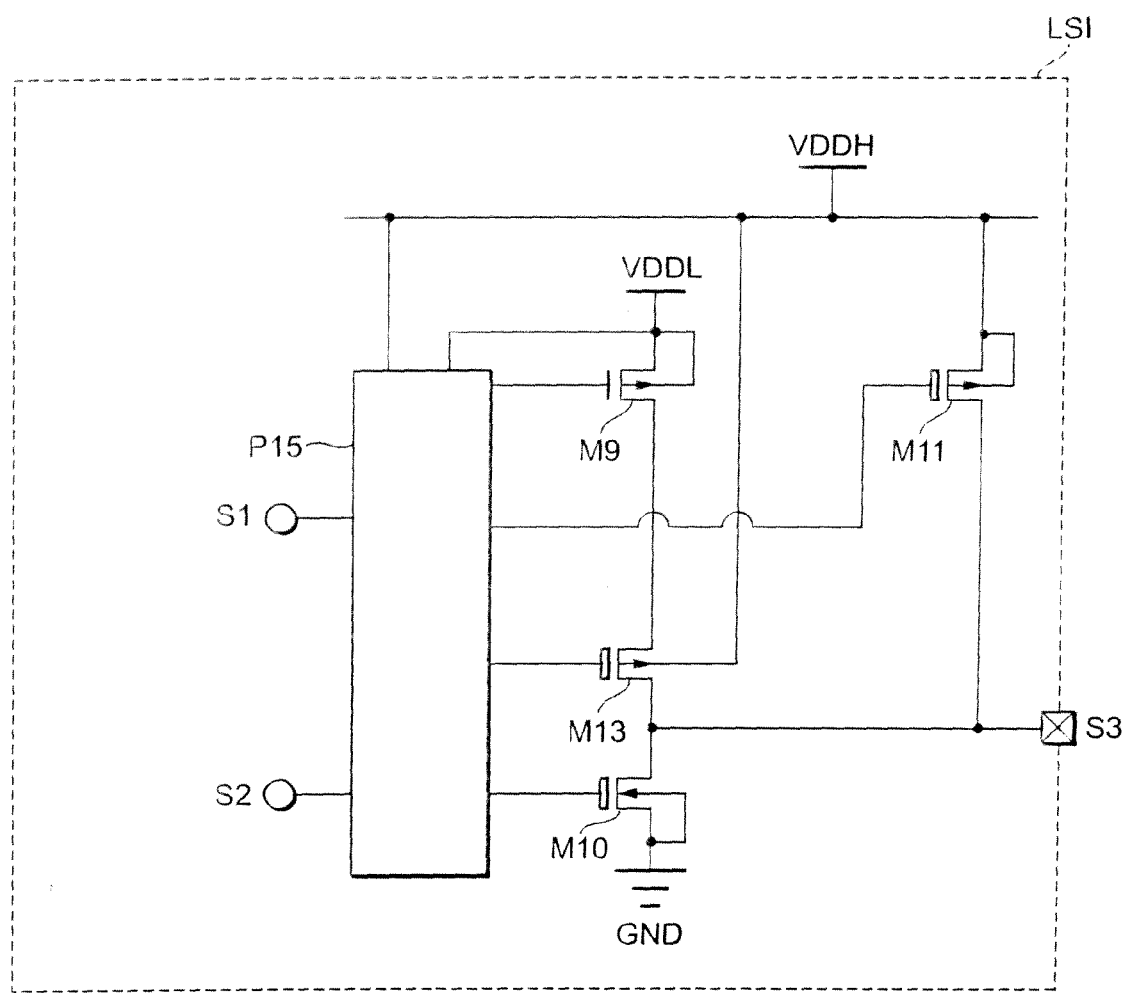
FIG. 5 is a circuit diagram of a tolerant buffer circuit according to a third exemplary embodiment of the present invention.

FIG. 5 is a circuit diagram of a tolerant buffer circuit according to a third exemplary embodiment. Here, the tolerant buffer circuit of FIG. 5 is the tolerant buffer circuit of FIG. 1 from which the NMOS transistor M14 is deleted. Since other configurations are the same as those of FIG. 1, description thereof will be omitted.

Figure 6:
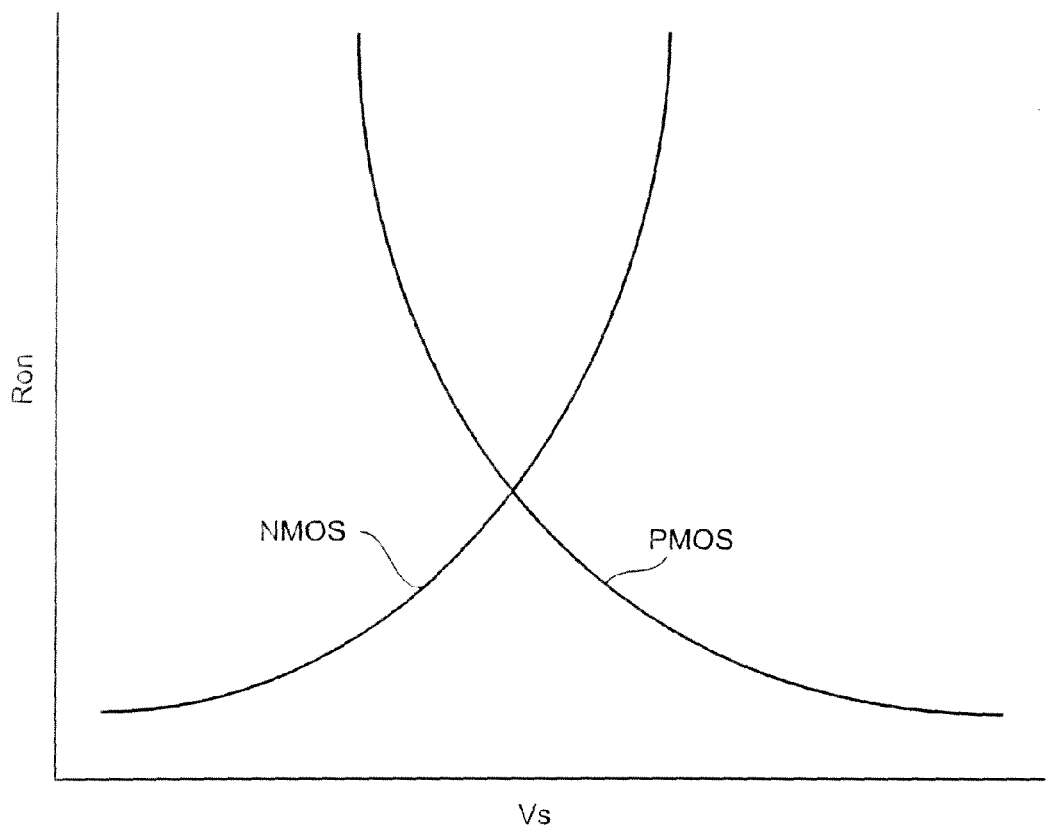
FIG. 6 is a Vs-Ron characteristic diagram showing a change of a drain-source resistance with respect to a source voltage of a transistor.

FIG. 6 is a Vs-Ron characteristic diagram showing a change of a drain-source resistance Ron with respect to a source voltage Vs of a transistor. This shows the PMOS transistor and the NMOS transistor being in comparison. In the PMOS transistor M13, the power supply voltage VDDH is always fed to its backgate, and the control signal of the power supply voltage VDDH or ground voltage GND is fed to its gate. When a source voltage Vs is made equal to the power supply voltage VDDL, if the PMOS transistor M13 can be used in a domain where the drain-source resistance Ron becomes sufficiently low in FIG. 6, even if the NMOS transistor M14 is deleted from the first exemplary embodiment, then it will be possible to produce the same effect as that of the first exemplary embodiment. By the deletion of the NMOS transistor M14, it is possible to simplify and miniaturize the circuit.

Fourth Exemplary Embodiment

Figure 7:
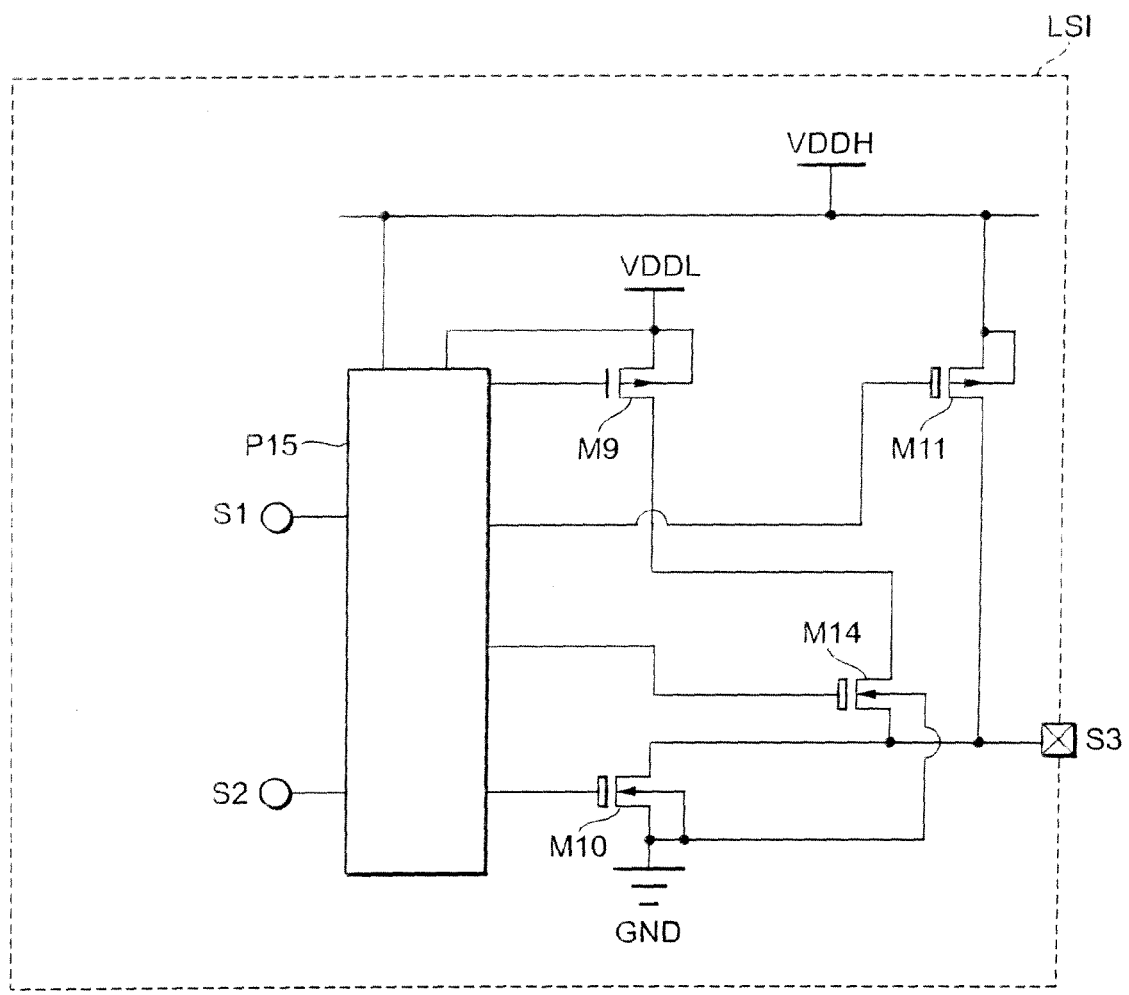
FIG. 7 is a circuit diagram of a tolerant buffer circuit according to a fourth exemplary embodiment of the present invention.

FIG. 7 is a circuit diagram of a tolerant buffer circuit according to a fourth exemplary embodiment. Here, the tolerant buffer circuit of FIG. 7 is the tolerant buffer circuit of FIG. 1 from which the PMOS transistor M13 is deleted. Since other configurations are the same as those of FIG. 1, description thereof will be omitted.

In the NMOS transistor M14, the ground voltage GND is always fed to its backgate, and the control signal of the power supply voltage VDDH or ground voltage GND is fed to its gate. When the source voltage Vs is set to the power supply voltage VDDL, if the NMOS transistor M14 can be used in a domain where the drain-source resistance Ron becomes sufficiently low in FIG. 6, then it is possible to produce the same effect as that of the first exemplary embodiment even when the PMOS transistor M13 is when deleted from the first exemplary embodiment. By the deletion of the PMOS transistor M13, it is possible to simplify and miniaturize the circuit.

The present invention is not limited to the above exemplary embodiments, but can be appropriately changed without departing from the subject matter of the present invention.

Further, it is noted that Applicant's intent is to encompass equivalents of all claim elements, even if amended later during prosecution.

What is claimed is:

1. A buffer circuit comprising:
a first node receiving a first voltage;
a second node receiving a second voltage lower than the first voltage;
a third node;
an output node driving the first voltage and the second voltage;
a first transistor coupled between the first node and the output node;
a second transistor coupled between the second node and the output node, one end of the second transistor being connected to the second node, another end of the second transistor being connected to the third node; and
a switch circuit coupled between the output node and the third node,
wherein each of the first transistor and a transistor included in the switch circuit has a first breakdown voltage, and
wherein the second transistor has a second breakdown voltage being different from the first breakdown voltage;
a fourth node receiving a third voltage lower than the second voltage; and
a third transistor coupled between the fourth node and the output node.

2. The buffer circuit according to claim 1,
wherein the first breakdown voltage is higher than the second breakdown voltage.

3. The buffer circuit according to claim 1,
wherein the first transistor includes a backgate receiving the first voltage,
wherein the second transistor includes a backgate receiving the second voltage, and
wherein the switch circuit is controlled by a signal of the first voltage level.

4. The buffer circuit according to claim 1,
wherein the switch circuit turns on when the second transistor is ON, and
wherein the switch circuit turns off when the second transistor is OFF.

5. The buffer circuit according to claim 1,
wherein the switch circuit includes a PMOS transistor and an NMOS transistor mutually connected in parallel, and
wherein the PMOS transistor has the first breakdown voltage.

6. The buffer circuit according to claim 1,
wherein the switch circuit only includes a PMOS transistor, and
wherein the PMOS transistor has the first breakdown voltage.

7. An apparatus comprising:
the buffer circuit according to claim 1,
a first integrated circuit that receives the first voltage from the buffer circuit; and
a second integrated circuit that receives the second voltage from the buffer circuit.

8. The apparatus according to claim 7,
wherein the buffer circuit further comprises a logic circuit that receives a control signal indicating one of the first voltage and the second voltage, and
wherein the logic circuit drives one of the first voltage and the second voltage in response to the control signal.

9. The apparatus according to claim 8,
wherein the logic circuit turns the switch circuit off when the control signal indicates the first voltage, and
wherein the logic circuit turns the switch circuit on when the control signal indicates the second voltage.

* * * * *